(12) United States Patent
Hiroi et al.

(10) Patent No.: US 11,804,659 B2
(45) Date of Patent: Oct. 31, 2023

(54) ELECTROMAGNETIC WAVE ABSORBING COMPOSITION, AND ELECTROMAGNETIC WAVE ABSORPTION BODY

(71) Applicant: Maxell, Ltd., Kyoto (JP)

(72) Inventors: Toshio Hiroi, Kyoto (JP); Masao Fujita, Kyoto (JP)

(73) Assignee: Maxell, Ltd., Kyoto (JP)

( * ) Notice: Subject to any disclaimer, the term of this patent is extended or adjusted under 35 U.S.C. 154(b) by 461 days.

(21) Appl. No.: 16/632,066

(22) PCT Filed: Jul. 20, 2018

(86) PCT No.: PCT/JP2018/027271
§ 371 (c)(1),
(2) Date: Jan. 17, 2020

(87) PCT Pub. No.: WO2019/017471
PCT Pub. Date: Jan. 24, 2019

(65) Prior Publication Data
US 2020/0227833 A1    Jul. 16, 2020

(30) Foreign Application Priority Data

Jul. 20, 2017  (JP) ................. 2017-141159

(51) Int. Cl.
*H01Q 17/00*    (2006.01)
*C08K 3/04*    (2006.01)
(Continued)

(52) U.S. Cl.
CPC .......... *H01Q 17/004* (2013.01); *C01G 49/00* (2013.01); *C08K 3/04* (2013.01); *C08K 3/22* (2013.01);
(Continued)

(58) Field of Classification Search
CPC . C01G 49/00; C08K 3/04; C08K 3/22; C08K 2003/2272; C08L 101/12; H01Q 17/004; H05K 9/0075
See application file for complete search history.

(56) References Cited

U.S. PATENT DOCUMENTS 9,806,427 B2 * 10/2017 Ohkoshi ............ C01G 49/0018
2003/0079893 A1 * 5/2003 Hashimoto .......... H05K 9/0088
174/394
(Continued)

FOREIGN PATENT DOCUMENTS

EP     2 058 824 A1    5/2009
JP     1-150528 A      6/1989
(Continued)

OTHER PUBLICATIONS

International Search Report, issued in PCT/JP2018/027271, dated Oct. 23, 2018.
Extended European Search Report for European Application No. 18834359.4, dated Mar. 16, 2021.
European Communication pursuant to Article 94(3) EPC for European Application No. 18834359.4, dated Apr. 5, 2023.

*Primary Examiner* — James C Goloboy
(74) *Attorney, Agent, or Firm* — Birch, Stewart, Kolasch & Birch, LLP (57) ABSTRACT

Provided are an electromagnetic-wave absorbing composition that can favorably absorb electromagnetic waves of high frequencies in or above a millimeter-wave band and that can be applied to a desired portion in the form of a paste, and an easily deformable electromagnetic-wave absorber having flexibility. The electromagnetic-wave absorbing composition includes a rubber binder, a filler made of a particulate carbon material, and a magnetic iron oxide that magnetically resonates in a frequency band in or above a millimeter-wave band as an electromagnetic-wave absorbing material. The electromagnetic-wave absorber includes a rubber binder 1b, a filler 1c made of a particulate carbon material, and a magnetic iron oxide that magnetically reso- (Continued)

nates in a frequency band in or above a millimeter-wave band as an electromagnetic-wave absorbing material 1*a*, and is a nonresonant-type electromagnetic-wave absorber that is not provided with a reflective layer for reflecting incident electromagnetic waves.

5 Claims, 6 Drawing Sheets (51) Int. Cl.
- *C08K 3/22* (2006.01)
- *H05K 9/00* (2006.01)
- *C01G 49/00* (2006.01)
- *C08L 101/12* (2006.01)

(52) U.S. Cl.
CPC ... H05K 9/0075 (2013.01); *C08K 2003/2272* (2013.01); *C08L 101/12* (2013.01)

(56) References Cited

U.S. PATENT DOCUMENTS

| | | |
|---|---|---|
| 2010/0238063 A1 | 9/2010 | Ohkoshi et al. |
| 2016/0164187 A1 | 6/2016 | Ohkoshi et al. |
| 2017/0349448 A1 | 12/2017 | Ohkoshi et al. |

FOREIGN PATENT DOCUMENTS

| | | |
|---|---|---|
| JP | 2001-44687 A | 2/2001 |
| JP | 2002-280208 A | 9/2002 |
| JP | 2004-356465 A | 12/2004 |
| JP | 2007-208121 A | 8/2007 |
| JP | 2008-60484 A | 3/2008 |
| JP | 2008-277726 A | 11/2008 |
| JP | 2011-233834 A | 11/2011 |
| JP | 2016-111341 A | 6/2016 |
| JP | 2016-135737 A | 7/2016 |

\* cited by examiner

ELECTROMAGNETIC WAVE ABSORBING COMPOSITION, AND ELECTROMAGNETIC WAVE ABSORPTION BODY

TECHNICAL FIELD

The present disclosure relates to an electromagnetic-wave absorbing composition and an electromagnetic-wave absorber that have properties of absorbing electromagnetic waves, and in particular relates to an electromagnetic-wave absorbing composition and an electromagnetic-wave absorber that include powder of a magnetic iron oxide as an electromagnetic-wave absorbing material and thus can absorb electromagnetic waves of high frequencies in a frequency band in or above a millimeter-wave band.

BACKGROUND ART

To avoid the influence of leaked electromagnetic waves emitted to the outside from an electric circuit or the like and undesirably reflected electromagnetic waves, electromagnetic-wave absorbing compositions for absorbing electromagnetic waves have been used. Such electromagnetic-wave absorbing compositions are molded into a predetermined shape such as a block-shaped electromagnetic-wave absorber or an electromagnetic-wave absorbing sheet depending on the form to be used as an electromagnetic-wave absorbing member.

Meanwhile, research on techniques utilizing high frequency electromagnetic waves, including centimeter waves having a frequency of several gigahertz (GHz), millimeter waves having a frequency of 30 GHz to 300 GHz, and electromagnetic waves having an even higher frequency of one terahertz (THz) as electromagnetic waves in a high frequency band above the millimeter-wave band, has recently proceeded for mobile communications such as mobile phones, wireless LAN and electric toll collection system (ETC). In response to the trend of techniques utilizing electromagnetic waves of higher frequencies, there is a growing demand for electromagnetic-wave absorbing compositions and electromagnetic-wave absorbers for absorbing unnecessary electromagnetic waves to absorb electromagnetic waves in higher frequency bands from the gigahertz band to the terahertz band.

Conventionally, as electromagnetic-wave absorbers for absorbing electromagnetic waves in a high frequency band in or above the millimeter-wave band, Patent Document 1 proposes an electromagnetic-wave absorber that has a packed structure of particles having epsilon iron oxide ($\varepsilon$-$Fe_2O_3$) crystal in the magnetic phase, the epsilon iron oxide exhibiting an electromagnetic-wave absorbing capacity in a range from 25 to 100 GHz (see Patent Document 1). Patent Document 2 proposes a sheet-shaped oriented body obtained by mixing and kneading fine epsilon iron oxide particles with a binder, and applying a magnetic field to the mixture from the outside during dry curing of the binder to improve the magnetic field orientation of the epsilon iron oxide particles (see Patent Document 2).

Furthermore, Patent Document 3 proposes an elastic electromagnetic-wave absorbing sheet that can absorb centimeter waves, wherein carbon nanotubes are dispersed in silicone rubber (see Patent Document 3).

Patent Document 4 proposes a thin electromagnetic-wave absorber including epsilon iron oxide as an electromagnetic-wave absorbing material. The electromagnetic-wave absorber includes a planar, metal substrate made of metal such as aluminum and an electromagnetic-wave absorption film stacked on the substrate. The electromagnetic-wave absorption film including the epsilon iron oxide and carbon nanotubes has a relative permittivity of 6.5 to 65 (see Patent Document 4).

PRIOR ART DOCUMENTS

Patent Documents

Patent Document 1: JP 2008-060484 A
Patent Document 2: JP 2016-135737 A
Patent Document 3: JP 2011-233834 A
Patent Document 4: JP 2016-111341A

DISCLOSURE OF INVENTION

Problem to be Solved by the Invention

To shield electromagnetic waves leaking from an electromagnetic-wave generation source, an electromagnetic-wave absorber needs to be arranged in a housing or the like that covers a target circuit component. Specifically, if the shape of the arrangement location is not flat, it is more convenient to use an easily deformable, sheet-shaped electromagnetic-wave absorber having flexibility and elasticity of elongating in an in-plane direction, rather than using a solid, block-shaped electromagnetic-wave absorber and a planar electromagnetic-wave absorber.

Moreover, for example, by applying a paste-like electromagnetic-wave absorbing composition to an electric circuit board in which an electronic component is mounted on a resin printed board to cover a portion that needs to be covered, it is possible to provide a configuration that effectively shields leaked electromagnetic waves and avoids the influence of electromagnetic disturbance from the outside, with a less amount of electromagnetic-wave absorbing composition.

However, as electromagnetic-wave absorbing members that can absorb electromagnetic waves in a frequency band of several tens of GHz or higher (millimeter-wave band), electromagnetic-wave absorbing compositions that can be applied to a circuit board or elastic sheet-shaped electromagnetic-wave absorbers have not yet been realized.

To solve the above conventional problems, it is an object of the present disclosure to provide an electromagnetic-wave absorbing composition that can favorably absorb electromagnetic waves of high frequencies in or above a millimeter-wave band and that can be applied to a desired portion in the form of a paste, and an easily deformable electromagnetic-wave absorber having flexibility.

Means for Solving Problem

In order to solve the above problems, an electromagnetic-wave absorbing composition disclosed in the present application includes a rubber binder, a filler made of a particulate carbon material, and a magnetic iron oxide that magnetically resonates in a frequency band in or above a millimeter-wave band as an electromagnetic-wave absorbing material.

An electromagnetic-wave absorber disclosed in the present application includes a rubber binder, a filler made of a particulate carbon material, and a magnetic iron oxide that magnetically resonates in a frequency band in or above a millimeter-wave band as an electromagnetic-wave absorbing material. The electromagnetic-wave absorber is a non-resonant-type electromagnetic-wave absorber that is not provided with an electromagnetic-wave reflective layer for reflecting incident electromagnetic waves.

Effects of the Invention

Since both of the electromagnetic-wave absorbing composition and the electromagnetic-wave absorber disclosed in the present application include the magnetic iron oxide that magnetically resonates in a high frequency band in or above a millimeter-wave band as the electromagnetic-wave absorbing material, they can convert electromagnetic waves in the high frequency band in or above several tens of GHz into heat and absorb the electromagnetic waves. Moreover, since the rubber binder is used, the electromagnetic-wave absorbing composition can be used as a paste-like electromagnetic-wave absorbing coating material, and the electromagnetic-wave absorber can be used as a nonresonant-type, sheet-shaped electromagnetic-wave absorber elongating a predetermined amount in an in-plane direction.

DESCRIPTION OF THE INVENTION

An electromagnetic-wave absorbing composition disclosed in the present application includes a rubber binder, a filler made of a particulate carbon material, and a magnetic iron oxide that magnetically resonates in a frequency band in or above a millimeter-wave band as an electromagnetic-wave absorbing material.

With this configuration, the electromagnetic-wave absorbing composition disclosed in the present application can absorb electromagnetic waves of high frequencies of 30 GHz or higher (millimeter-wave band) by the magnetic resonance of the electromagnetic-wave absorbing material. Moreover, since the electromagnetic-wave absorbing material and the rubber binder are used, the electromagnetic-wave absorbing composition can be in the form of a paste. For example, the paste-like electromagnetic-wave absorbing composition can be applied to an electric circuit board in which an electronic component is mounted on a resin printed board to cover a portion that needs to be covered, thereby shielding leaked electromagnetic waves. Further, since the electromagnetic-wave absorbing composition includes the filler made of a particulate carbon material, the decrease in the electric resistance of the electromagnetic-wave absorbing composition can be eliminated or reduced while enhancing the permittivity.

The term "particulate carbon material" in the present specification refers to a material having a ratio of the maximum diameter to the minimum diameter of primary particles of a carbon material ranging from about 1 to 2. For example, the ratio can be determined by photographing a filler made of a carbon material at 100000× using a scanning electron microscope (SEM), selecting any 100 particles from one photograph, measuring the maximum diameters and the minimum diameters of the selected particles to obtain the ratios, and determine the mean value of the ratios. The "particulate carbon material" of the present invention do not include needle-like carbon nanotubes or cylindrical carbon nanotubes because the ratio of the maximum diameter to the minimum diameter of the primary particles of these carbon nanotubes is 2 or more. In this respect, the "particulate carbon material" of the present invention can be considered as "non-carbon nanotube carbon materials".

In the electromagnetic-wave absorbing composition disclosed in the present application, it is preferred that the magnetic iron oxide is epsilon iron oxide or strontium ferrite. By using epsilon iron oxide or strontium ferrite as the electromagnetic-wave absorbing material that absorbs electromagnetic waves of high frequencies of 30 GHz or higher by magnetical resonance, it is possible to provide an electromagnetic-wave absorbing composition that absorbs high frequency electromagnetic waves.

In this case, it is preferred that part of Fe sites of the epsilon iron oxide is substituted with a trivalent metal atom. By doing so, it is possible to provide an electromagnetic-wave absorbing composition that absorbs electromagnetic waves in a desired frequency band by utilizing the properties of epsilon iron oxide whose magnetic resonance frequency changes depending on a material with which the Fe sites are substituted.

When the magnetic iron oxide is 60 parts by volume or more and 110 parts by volume or less with respect to 100 parts by volume of the rubber binder, and $\alpha$ represents parts by volume of the rubber binder, $\beta$ represents parts by volume of the magnetic iron oxide, and $\gamma$ represents parts by volume of the filler, it is preferable that the value of $(\beta+\gamma)/(\alpha+\beta+\gamma)\times 100$ is 43.0 or more and 52.0 or less. By doing so, it is possible to obtain an electromagnetic-wave absorbing composition having easily deformable elasticity and the attenuation amount of electromagnetic waves passing therethrough of −8.5 dB or more as electromagnetic-wave absorbing properties.

Further, in this case, it is more preferable that the value of $\gamma/(\alpha+\beta+\gamma)\times 100$ is 1.2 or more and 3.2 or less. By doing so, it is possible to obtain, e.g., an electromagnetic-wave absorbing composition that is less likely to cause an undesired short circuit or the like even when the electromagnetic-wave absorbing composition is applied directly to an electronic component that will be a noise source on an electric circuit board.

The electromagnetic-wave absorber disclosed in the present application includes a rubber binder, a filler made of a particulate carbon material, and a magnetic iron oxide that magnetically resonates in a frequency band in or above a millimeter-wave band as an electromagnetic-wave absorbing material, and is a nonresonant-type electromagnetic-wave absorber that is not provided with an electromagnetic-wave reflective layer for reflecting incident electromagnetic waves.

With this configuration, the electromagnetic-wave absorber disclosed in the present application can absorb electromagnetic waves of high frequencies of 30 GHz or higher (millimeter-wave band) by the magnetic resonance of the electromagnetic-wave absorbing material. Moreover, since the electromagnetic-wave absorbing material and the rubber binder are used, the electromagnetic-wave absorber can be a sheet-shaped, nonresonant-type electromagnetic-wave absorber having elasticity of elongating in an in-plane direction. Thus, for example, the electromagnetic-wave absorber can easily be attached to a curved portion. Further, since the electromagnetic-wave absorber includes the filler made of a particulate carbon material, the decrease in the electric resistance of the electromagnetic-wave absorbing composition can be eliminated or reduced, and the permittivity of the electromagnetic-wave absorbing composition can be enhanced.

In the electromagnetic-wave absorber disclosed in the present application, it is preferred that the magnetic iron oxide is epsilon iron oxide or strontium ferrite. By using epsilon iron oxide or strontium ferrite as the electromagnetic-wave absorbing material that absorbs electromagnetic waves of high frequencies of 30 GHz or higher by magnetical resonance, it is possible to provide an electromagnetic-wave absorber that absorbs high frequency electromagnetic waves.

In this case, it is preferred that part of Fe sites of the epsilon iron oxide is substituted with a trivalent metal atom. By doing so, it is possible to provide an electromagnetic-wave absorber that absorbs electromagnetic waves in a desired frequency band by utilizing the properties of epsilon iron oxide whose magnetic resonance frequency changes depending on a material with which the Fe sites are substituted.

When the magnetic iron oxide is 60 parts by volume or more and 110 parts by volume or less with respect to 100 parts by volume of the rubber binder, and $\alpha$ represents parts by volume of the rubber binder, $\beta$ represents parts by volume of the magnetic iron oxide, and $\gamma$ represents parts by volume of the filler, it is preferable that the value of $(\beta+\gamma)/(\alpha+\beta+\gamma)\times 100$ is 43.0 or more and 52.0 or less. By doing so, it is possible to obtain an electromagnetic-wave absorber having high elasticity and high electromagnetic-wave absorbing properties of the electromagnetic wave attenuation rate of $-8.5$ dB or more.

Further, in this case, it is more preferable that the value of $\gamma/(\alpha+\beta+\gamma)\times 100$ is 1.2 or more and 3.2 or less. By doing so, it is possible to provide, e.g., an electromagnetic-wave absorber that is less likely to cause an undesired short circuit even when the electromagnetic-wave absorber is mounted directly on an electronic circuit component.

It is preferable that the electromagnetic-wave absorber disclosed in the present application has a thickness of 400 µm or more in an incident direction of electromagnetic waves. By doing so, it is possible to provide an electromagnetic-wave absorber having properties of absorbing electromagnetic waves passing therethrough (attenuation rate) of $-10$ dB or more.

Further, it is preferable that an adhesive layer is stacked on either of surfaces of the electromagnetic-wave absorber. By doing so, it is possible to obtain an electromagnetic-wave absorber that can easily be attached to an adherend.

Hereinafter, the electromagnetic-wave absorbing composition and the electromagnetic-wave absorber disclosed in the present application will be described with reference to the drawings.

Embodiment

[Configuration of Sheet-Shaped Electromagnetic-Wave Absorber]

Figure 1:
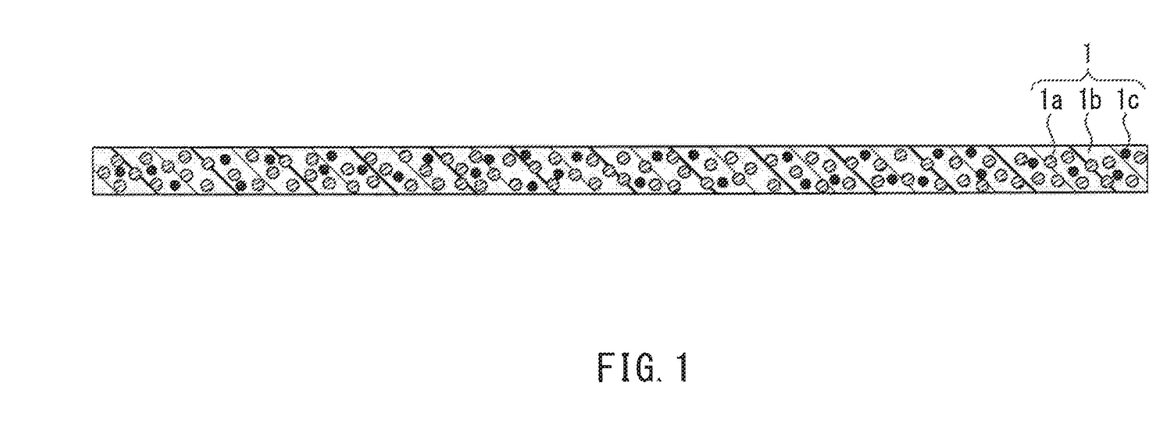
FIG. 1 is a cross-sectional view illustrating the configuration of a sheet-shaped electromagnetic-wave absorber of this embodiment.

FIG. 1 is a cross-sectional view illustrating the configuration of an electromagnetic-wave absorbing sheet as the electromagnetic-wave absorber of this embodiment. The electromagnetic-wave absorbing sheet as illustrated in FIG. 1 can be considered as an electromagnetic-wave absorber produced in a sheet shape using the electromagnetic-wave absorbing composition of this embodiment as a material therefor.

FIG. 1 is illustrated for the sake of easy understanding of the configuration of the electromagnetic-wave absorbing sheet described in this embodiment, and does not faithfully reflect the actual sizes or thicknesses of members illustrated therein.

An electromagnetic-wave absorbing sheet 1 exemplified in this embodiment includes magnetic iron oxide powder 1$a$ as an electromagnetic-wave absorbing material, a rubber binder 1$b$, and a filler 1$c$ made of a carbon material.

In the electromagnetic-wave absorbing sheet 1, the magnetic iron oxide powder 1$a$ magnetically resonates, and converts electromagnetic waves into heat energy by magnetic loss to absorb the electromagnetic waves. Thus, the electromagnetic-wave absorbing sheet 1 itself can absorb electromagnetic waves passing therethrough. Generally, there are two forms of the electromagnetic-wave absorbing sheet as follows. The one is a resonance-type (also referred to as a reflection-type or $\lambda/4$ type) electromagnetic-wave absorbing sheet. The resonance-type electromagnetic-wave absorbing sheet includes a reflective layer (electromagnetic-wave shielding layer) made of a metal layer on a surface of the electromagnetic-wave absorbing layer on a side opposite to the electromagnetic-wave incident side. The resonance-type electromagnetic-wave absorbing sheet absorbs electromagnetic waves by a resonance effect produced when the electromagnetic waves that have reflected on the reflective layer again pass through the electromagnetic-wave absorbing layer to be emitted. The other is a nonresonant-type (also referred to as a transmission-type) electromagnetic-wave absorbing sheet. The nonresonant-type electromagnetic-wave absorbing sheet is not provided with a reflective layer and allows electromagnetic waves incident upon the electromagnetic-wave absorbing layer to pass therethrough and emit to a side opposite to the electromagnetic-wave incident side. The electromagnetic-wave absorbing sheet described in this embodiment can be realized as a nonresonant-type electromagnetic-wave absorbing sheet that is not provided with a reflective layer. Examples of the reflective layer used for the electromagnetic-wave absorbing sheet include a metal foil and a metal-deposited film to obtain good reflection properties. However, these reflective layers do not have elasticity. Even if the electromagnetic-wave absorbing layer has high elasticity, the elasticity of the electromagnetic-wave absorbing sheet is limited when the electromagnetic-wave absorbing layer is stacked on such a reflective layer. In this respect, since the magnetic iron oxide powder 1$a$ magnetically resonates to absorb electromagnetic waves, the electromagnetic-wave absorbing sheet described in this embodiment can exhibit high electromagnetic wave attenuation properties of $-8.5$ dB or more although the electromagnetic-wave absorbing sheet is a nonresonant-type electromagnetic-wave absorbing sheet.

Moreover, in the electromagnetic-wave absorbing sheet 1 described in this embodiment, various kinds of rubber materials can be used as the binder 1b constituting the sheet. Particularly when the electromagnetic-wave absorbing sheet 1 is made thin, it can elongate and contract easily in an in-plane direction. Further, since the electromagnetic-wave absorbing sheet 1 has high elasticity and high flexibility, it can be rolled up in handling and easily arranged along a curved surface.

In forming the electromagnetic-wave absorbing sheet, when the electromagnetic-wave absorbing layer is thin, in some cases the electromagnetic-wave absorbing layer is stacked on a resin substrate to form an electromagnetic-wave absorbing sheet to maintain a certain strength as a sheet and to be handled easily. In this respect, it is preferred that the electromagnetic-wave absorbing sheet 1 described in this embodiment is configured using a self-supported electromagnetic-wave absorbing layer that is not provided with a substrate and that includes magnetic iron oxide powder as an electromagnetic-wave absorbing material, a rubber binder, and a filler, from the viewpoint of maintaining high elasticity exhibited by including the rubber binder and from the viewpoint that a nonresonant-type electromagnetic-wave absorbing sheet preferably has a certain thickness (in one example, 400 μm) because the electromagnetic-wave absorbing properties improve as the thickness of the electromagnetic-wave absorbing sheet increases, as will be described later.

Meanwhile, considering the convenience at the time of attaching the electromagnetic-wave absorbing sheet to a predetermined location to absorb and shield electromagnetic waves, the adhesive layer may be preferably stacked on either of the surfaces of the electromagnetic-wave absorbing sheet (i.e., the upper side or lower side of FIG. 1).

[Electromagnetic-Wave Absorbing Material]

In the electromagnetic-wave absorbing sheet of this embodiment, the magnetic iron oxide powder 1a as the electromagnetic-wave absorbing material may be magnetic powder of epsilon iron oxide.

The epsilon phase of epsilon iron oxide ($\varepsilon$-$Fe_2O_3$) is a phase that appears between the alpha phase ($\alpha$-$Fe_2O_3$) and the gamma phase ($\gamma$-$Fe_2O_3$) in ferric oxide ($Fe_2O_3$). Epsilon iron oxide is a magnetic material that can be obtained in a single phase state through a nanoparticle synthesis method that combines a reverse micelle method and a sol-gel method.

Epsilon iron oxide is a fine particle of several nm to several tens of nm but has a coercive force of about 20 kOe at room temperature, which is the largest coercive force among metal oxides. Further, the natural magnetic resonance by a gyromagnetic effect based on the precession occurs in a frequency band of several tens of gigahertz or higher (millimeter-wave band). Thus, epsilon iron oxide has high effects of absorbing electromagnetic waves with high frequencies of 30 to 300 GHz (millimeter-wave band) or higher.

In epsilon iron oxide, by substituting part of Fe sites of the crystal with a trivalent metal element such as aluminum (Al), gallium (Ga), rhodium (Rh), or indium (In), it is possible to change a magnetic resonance frequency, i.e., a frequency of electromagnetic waves to be absorbed when epsilon iron oxide is used as the electromagnetic-wave absorbing material.

For example, epsilon iron oxide substituted with gallium, i.e., $\varepsilon$-$Ga_xFe_{2-x}O_3$, has an absorption peak in a frequency band from about 30 GHz to 150 GHz as a result of adjusting the substitution amount "x". Epsilon iron oxide substituted with aluminum, i.e., $\varepsilon$-$Al_xFe_{2-x}O_3$, has an absorption peak in a frequency band from about 100 GHz to 190 GHz as a result of adjusting the substitution amount "x". Further, in the case of using epsilon iron oxide in which part of Fe sites is substituted with rhodium ($\varepsilon$-$Rh_xFe_{2-x}O_3$), it is possible to shift the frequency band of electromagnetic waves to be absorbed in an even higher direction of 180 GHz or higher. Therefore, the frequency of electromagnetic waves to be absorbed can be set to a desired value by selecting the type of the element with which the Fe sites of the epsilon iron oxide are substituted and adjusting the substitution amount of Fe so that the natural resonance frequency of the epsilon iron oxide will be a desired frequency to be absorbed by the electromagnetic-wave absorbing sheet.

Epsilon iron oxides including epsilon iron oxides in which part of the Fe sites is substituted with metal can be obtained easily on the market.

In the electromagnetic-wave absorbing sheet of this embodiment, the magnetic iron oxide powder 1a as the electromagnetic-wave absorbing material may be magnetic powder of hexagonal ferrite such as barium ferrite or strontium ferrite. Hexagonal ferrite has a larger magnetic anisotropy and thus has a larger coercive force than ferrite materials of another structure such as spinel ferrite. Thus, hexagonal ferrite may be used as an electromagnetic-wave absorbing material of the electromagnetic-wave absorber having high electromagnetic-wave absorbing properties.

Specifically, in a system in which Al is added to strontium ferrite ($SrFe_{12}O_{19}$), it is possible to shift a frequency indicative of the absorption of electromagnetic waves in a higher frequency side by adding Al. Therefore, for example, an electromagnetic-wave absorbing sheet for a 60 GHz wireless LAN can be formed by using strontium ferrite to which Al has been added as the magnetic iron oxide powder.

[Rubber Binder]

Various kinds of rubber materials can be used as the rubber binder 1b constituting the electromagnetic-wave absorbing sheet 1. Examples of the rubber materials include natural rubber (NR), isoprene rubber (IR), butadiene rubber (BR), styrene-butadiene rubber (SBR), butyl rubber (IIR), nitrile rubber (NBR), ethylene-propylene rubber (EPDM), chloroprene rubber (CR), acrylic rubber (ACM), chlorosulfonated polyethylene rubber (CSR), urethane rubber (PUR), silicone rubber (Q), fluororubber (FKM), ethylene-vinyl acetate rubber (EVA), epichlorohydrin rubber (CO), polysulfide rubber (T), and urethane rubber (U).

Moreover, rubber is defined as a material having rubber elasticity at room temperature. According to this definition, examples of the rubber binder 1b of the electromagnetic-wave absorbing sheet 1 described in this embodiment include thermoplastic elastomers such as a styrene-based thermoplastic elastomer (styrene-isoprene copolymer (SIS), styrene-butadiene copolymer (SBS)), an olefin-based thermoplastic elastomer, a urethane-based thermoplastic elastomer, and a polyester-based thermoplastic elastomer. These thermoplastic elastomers have fluidity at high temperature but have rubber elasticity at room temperature. These materials are broadly included as the rubber materials and explained in the present specification.

Among these rubber materials, acrylic rubber and silicone rubber are preferred because the heat resistance is high. Acrylic rubber offers excellent oil resistance even in high temperature environments while being relatively inexpensive and cost-effective. Silicone rubber offers not only high heat resistance but also high cold resistance. Moreover, the physical properties of silicone rubber are the most temperature-independent among synthetic rubbers, and silicone rubber offers excellent solvent resistance, ozone resistance, and weather resistance. Further, the silicone rubber has excellent electrical insulation properties while being physically stable in a wide temperature range and a wide frequency region.

[Filler]

By adding the filler $1c$, it is possible to improve electromagnetic-wave absorbing properties of the electromagnetic-wave absorbing sheet described in this embodiment.

The filler $1c$ is preferably a particulate carbon material. Specifically, carbon black (CB) is suitably used as the particulate carbon material. Various kinds of conductive carbon blacks such as conductive carbon black produced by a Furness method, acetylene black, and Ketjen black can be used as the carbon black that is a non-carbon nanotube carbon material.

The specific surface area of the particulate carbon material used as the filler $1c$ may be 30 to 2300 $m^2/g$. The specific surface area is preferably 300 to 2000 $m^2/g$, and more preferably 800 to 1800 $m^2/g$.

[Dispersant]

To favorably disperse the magnetic iron oxide powder as the electromagnetic-wave absorbing material in the rubber binder, it is more preferable to use a dispersant.

The dispersant may be a compound having a polar group such as a phosphate group, a sulfonic group, or a carboxy group. Among these, the dispersant is preferably a phosphate compound having a phosphate group in the molecule.

Examples of the phosphate compound include: allyl sulfonic acids such as phenylphosphonic acid and phenylphosphonic dichloride; alkylphosphonic acids such as methylphosphonic acid, ethylphosphonic acid, octylphosphonic acid, and propylphosphonic acid; and polyfunctional phosphonic acids such as hydroxyethanediphosphonic acid and nitrotris methylene phosphonic acid. These phosphate compounds are flame-retardant and function as dispersants for fine magnetic iron oxide powder, thereby favorably dispersing epsilon iron oxide particles or strontium ferrite particles in the binder.

Specifically, the dispersant may be phenylphosphonic acid (PPA) manufactured by FUJIFILM Wako Pure Chemical Corporation or Nissan Chemical Corporation, or an oxidized phosphoric acid ester "JP-502" (trade name) manufactured by JOHOKU CHEMICAL CO., LTD.

Examples of the dispersant contained in the electromagnetic-wave absorbing sheet described in this embodiment include: fatty acids with a carbon number of 12 to 18 (RCOOH, where R is an alkyl group or an alkenyl group with a carbon number of 11 to 17) such as caprylic acid, capric acid, lauric acid, myristic acid, palmitic acid, stearic acid, behenic acid, oleic acid, elaidic acid, linoleic acid, linolenic acid, and stearolic acid; metal soaps composed of alkali metals or alkali earth metals of the above fatty acids; compounds containing fluorine of the above fatty acid esters; amides of the above fatty acids; polyalkylene oxide alkylphosphate ester; lecithin; trialkyl polyolefin oxy-quaternary ammonium salt (where alkyl has a carbon number of 1 to 5, and olefin is ethylene, propylene or the like); and copper phthalocyanines other than the above phosphate compounds. Further, the dispersant may be a silane or silane coupling agent. These dispersants may be used singly or in a combination.

[Method for Producing Electromagnetic-Wave Absorbing Composition and Method for Producing Electromagnetic-Wave Absorbing Sheet]

The following describes a method for producing the electromagnetic-wave absorbing composition of this embodiment, and a method for producing the electromagnetic-wave absorbing sheet that is one form of the electromagnetic-wave absorber produced using the electromagnetic-wave absorbing composition.

The electromagnetic-wave absorbing composition of this embodiment is prepared as a magnetic compound including magnetic iron oxide powder, a rubber binder, and a filler. The electromagnetic-wave absorbing sheet as the electromagnetic-wave absorber of this embodiment is produced by subjecting the magnetic compound that is the electromagnetic-wave absorbing composition of this embodiment to press molding in a predetermined thickness.

First, a magnetic compound that is the electromagnetic-wave absorbing composition is prepared.

The magnetic compound can be obtained by mixing and kneading the magnetic iron oxide powder, the rubber binder and the filler, and mixing a crosslinking agent into the obtained kneaded mixture to adjust the viscosity.

In one example, 340 parts by weight of epsilon iron oxide substituted with gallium ($\varepsilon$-$Ga_{0.47}Fe_{1.53}O_3$) as the magnetic iron oxide powder, 100 parts by weight of silicone rubber KE-510-U (trade name, manufactured by Shin-Etsu Chemical Co., Ltd.) as the rubber binder, and 2.2 parts by weight of Ketjen black EC600JD (trade name, manufactured by Lion Specialty Chemicals Co., Ltd.) as the filler are kneaded with a pressurized batch-type kneader. As the crosslinking agent, 3 parts by weight of 2,5-dimethyl-2,5-bis hexane C-8A (trade name, manufactured by Shin-Etsu Chemical Co., Ltd.) is mixed with the kneaded mixture.

Since the electromagnetic-wave absorbing composition thus obtained includes the silicone rubber as a base, it can be applied, e.g., to cover a certain circuit component on a circuit board that will be a noise source. Moreover, since the electromagnetic-wave absorbing composition can be used as a filler for filling a space similarly to general silicone rubbers, it is possible to improve the properties of shielding leaked electromagnetic waves by injecting the composition into a space of a shielded housing configured by assembling metal plates.

The magnetic compound can be hardened by, e.g., heating or irradiation with UV light. Thus, an electromagnetic-wave absorbing composition having a desired shape can be obtained.

In the production of the electromagnetic-wave absorber, for example, the above obtained magnetic compound that is the electromagnetic-wave absorbing composition is subjected to crosslinking and molding into a sheet at a temperature of, e.g., 150° C. using a hydraulic pressing machine. Then, the sheet is subjected to secondary crosslinking in a thermostat at a temperature of e.g., 170° C. to obtain an electromagnetic-wave absorber having a predetermined shape.

[Adhesive Layer]

Although not illustrated in FIG. 1, an adhesive layer can be formed on either of major surfaces of the electromagnetic-wave absorbing sheet 1 as the electromagnetic-wave absorber of this embodiment.

By providing the adhesive layer, the electromagnetic-wave absorbing sheet 1 can be easily attached to a desired position such as an inner surface of a housing that contains an electric circuit, or an inner surface or outer surface of an electric device. Specifically, since the electromagnetic-wave absorbing sheet 1 of this embodiment includes the rubber binder and thus has elasticity, it can easily be attached even onto a curved, bent surface by the adhesive layer. Thereby, it is possible to improve the handleability of the electromagnetic-wave absorbing sheet. To prevent the adhesive layer from impairing the elongation of the electromagnetic-wave absorbing sheet 1 by elastic deformation, the materials, formation thickness and formation state of the adhesive layer are appropriately selected. Preferable examples of the materials include adhesive agents having a low glass-transition temperature (TO.

The adhesive layer may be formed of a known material generally used as an adhesive layer such as an adhesive tape, and examples of which include an acrylic adhesive, a rubber adhesive, and a silicone adhesive. A tackifier or crosslinking agent may be used to adjust the tackiness with respect to an adherend or reduce adhesive residues. The tackiness with respect to an adherend is preferably 5 N/10 mm to 12 N/10 mm. If the tackiness is smaller than 5 N/10 mm, the electromagnetic-wave absorbing sheet may be easily peeled off or displaced from an adherend. If the tackiness is larger than 12 N/10 mm, the electromagnetic-wave absorbing sheet is difficult to be peeled off from an adherend.

The thickness of the adhesive layer is preferably 20 μm to 100 μm. If the adhesive layer is thinner than 20 μm, the tackiness is low and the electromagnetic-wave absorbing sheet may be easily peeled off or displaced from an adherend. If the adhesive layer is thicker than 100 μm, the flexibility of the electromagnetic-wave absorbing sheet as a whole may deteriorate. Further, if the adhesive layer is thick, the electromagnetic-wave absorbing sheet is difficult to be peeled off from an adherend. If cohesion of the adhesive layer is low, an adhesive may remain on an adherend when the electromagnetic-wave absorbing sheet is peeled off from the adherend.

The adhesive layer in the present specification may be an adhesive layer for unpeelable attachment, or an adhesive layer for peelable attachment.

In attaching the electromagnetic-wave absorbing sheet to a predetermined surface, even when the electromagnetic-wave absorbing sheet is not provided with the adhesive layer, the electromagnetic-wave absorbing sheet 1 can be attached by imparting tackiness to the surface of a member on which the electromagnetic-wave absorbing sheet is to be arranged. A double-sided tape or an adhesive may be used to attach the electromagnetic-wave absorbing sheet to a predetermined site. In this respect, it is evident that the adhesive layer is not an essential component in the electromagnetic-wave absorbing sheet of this embodiment.

[Electric Resistance of Filler]

The electromagnetic-wave absorbing properties of the electromagnetic-wave absorbing composition of this embodiment are improved by adding the filler made of a particulate carbon material to the rubber binder. Meanwhile, by adding the filler, the electric resistance of the electromagnetic-wave absorbing composition is decreased. When the magnetic compound as the electromagnetic-wave absorbing composition is applied to an electronic component that will be a noise source on an electric circuit board, or when the electromagnetic-wave absorbing sheet is arranged in contact with a terminal of an electric circuit component, an undesired situation such as a short circuit between electronic components may occur if the electric resistance of the electromagnetic-wave absorbing composition or the electromagnetic-wave absorbing sheet is under a certain level.

Therefore, a relationship between the addition amount of the filler and the sheet resistance in the electromagnetic-wave absorbing composition was confirmed by preparing an electromagnetic-wave absorbing composition of Example in which carbon black was used as the filler made of a particulate carbon material, and an electromagnetic-wave absorbing composition of Comparative Example in which carbon nanotubes were used as the filler.

Figure 2:
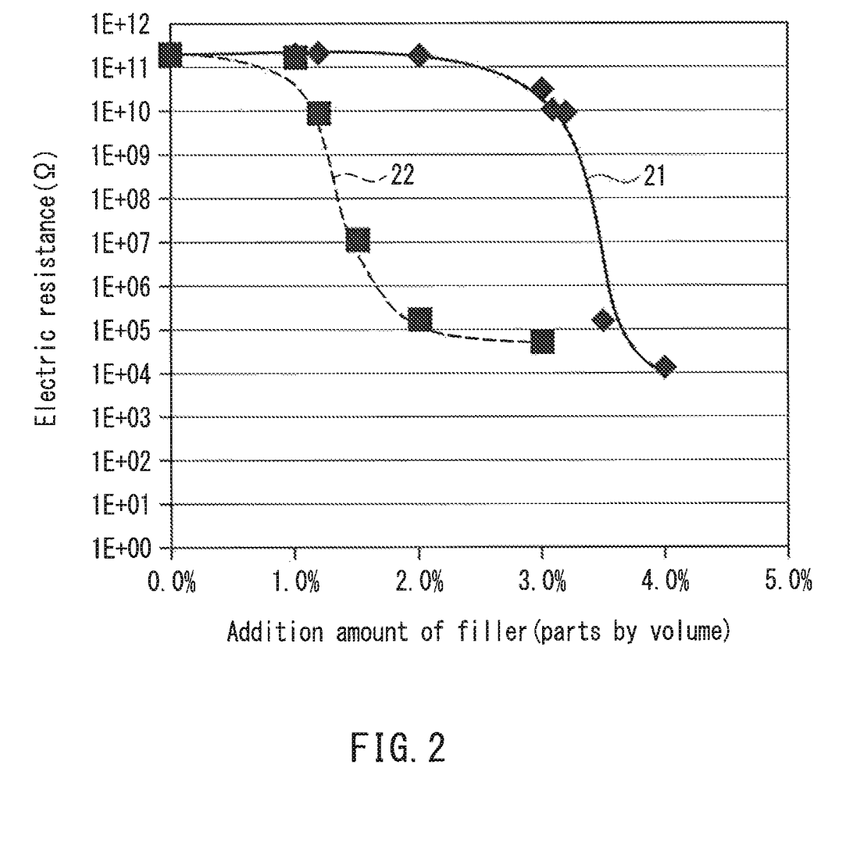
FIG. 2 is a graph illustrating a relationship between the addition amount of a filler and the electric resistance in an electromagnetic-wave absorbing composition of this embodiment.

FIG. 2 illustrates the results of the sheet resistance measured when the addition amounts of the carbon black and the carbon nanotubes as the filler were changed in the electromagnetic-wave absorbing compositions of this embodiment.

FIG. 2 illustrates the change in the sheet resistance when the addition amounts (parts by volume, i.e., percent by volume) of the carbon black and the carbon nanotubes as the filler added to the electromagnetic-wave absorbing compositions were changed.

The measurement was performed using the electromagnetic-wave absorbing compositions of this embodiment as a magnetic coating material to prepare electromagnetic-wave absorbing sheets of 12.25 mm wide×150 mm long×1 mm thick.

The surface electric resistance was measured as below using a high resistance meter 4329A (trade name) manufactured by Hewlett-Packard Company. Two brass blocks having a radius of curvature of 10 mm were disposed with an interval of 12.25 mm. A strip-shaped sheet was placed on the blocks so that a surface of the sheet would be in contact with the blocks. 50 gram weights were hung on the ends of the sheet. A detector was brought into contact with the blocks to measure the surface electric resistance.

In the electromagnetic-wave absorbing compositions of Example and Comparative Example, 340 parts by weight of epsilon iron oxide substituted with gallium ($\varepsilon$-$Ga_{0.47}Fe_{1.53}O_3$) and 100 parts by weight of silicone rubber KE-510-U (trade name) manufactured by Shin-Etsu Chemical Co., Ltd., as the rubber binder exemplified in the description of the production methods were used. As the filler, Ketjen black EC600JD (trade name, manufactured by Lion Specialty Chemicals Co., Ltd.) as carbon black was added to the electromagnetic-wave absorbing composition of Example, and C-tube 100 (trade name, manufactured by Korea CNT Co., Ltd.), as the carbon nanotubes was added to the electromagnetic-wave absorbing composition of Comparative Example.

The addition amounts of the carbon black and the carbon nanotubes as the filler were determined as below. The addition amounts in parts by weight (percent by weight) of the carbon black and the carbon nanotubes in the stage of forming the magnetic compound in the production of the electromagnetic-wave absorbing sheet were determined. These amounts were converted into parts by volume, with a density of the epsilon iron oxide being 4.9 g/cc, a density of the silicone rubber being 1.1 g/cc, an apparent density of the carbon blacks being 1.5 g/cc, and an apparent density of the carbon nanotube being 2.0 g/cc.

As illustrated in FIG. 2, a graph denoted by reference numeral 21 indicates a relationship between the addition amount of the filler and the electric resistance in the electromagnetic-wave absorbing composition to which the carbon black was added as the filler. This graph indicates that the electric resistance can be maintained at a level of 10 to the 10th power Ω (10 GΩ) by the addition amount of about 3%.

To prevent an undesired short circuit on an electric circuit board, it is considered that a sheet resistance needs to be at least about 1×10 to the 10th power (10 G) Ω. When the addition amount of the filler in the electromagnetic-wave absorbing composition of this embodiment in which the carbon black is used as the filler is adjusted to about 3% or less in parts by volume, it is possible to obtain the surface electric resistance at the level of 10 to the 10th power (10 G) Ω, which is sufficient to eliminate or reduce a short circuit.

Meanwhile, a graph denoted by reference numeral 22 indicates a relationship between the addition amount of the filler and the electric resistance in the electromagnetic-wave absorbing composition of Comparative Example to which the carbon nanotubes were added as the filler. This graph indicates that, although the electric resistance at the level of 10 to the 10th power Ω (10 GΩ) can be achieved by the addition amount of the filler of about 1% parts by volume, the electric resistance becomes 10 to the 10th power Ω or lower when the addition amount is 1.5%. Therefore, a short circuit is more likely to occur when the electromagnetic-wave absorbing composition is applied directly on an electronic component on an electric circuit board.

When the carbon nanotubes are used as the filler, the decrease degree of the sheet resistance with respect to the addition amount of the filler becomes large as compared with the case of using the carbon black as the filler. The reason for this is considered as follows. Since the carbon nanotubes are in a needle or cylindrical shape, and the particle size of the carbon nanotubes is extremely smaller than that of the carbon black, a passage through which current flows is more easily formed in the magnetic compound.

In view of this, by using the particulate carbon material such as carbon black that is a non-carbon nanotube carbon material as the filler, it is possible to increase the addition amount of the filler made of a carbon material to increase the permittivity of the electromagnetic-wave absorbing composition and the electromagnetic-wave absorber in order to improve the electromagnetic-wave absorbing properties while preventing the decrease in the electric resistance to eliminate or reduce the likelihood of an undesired short circuit, as compared with the case of using the carbon nanotubes as the filler.

Figure 6:
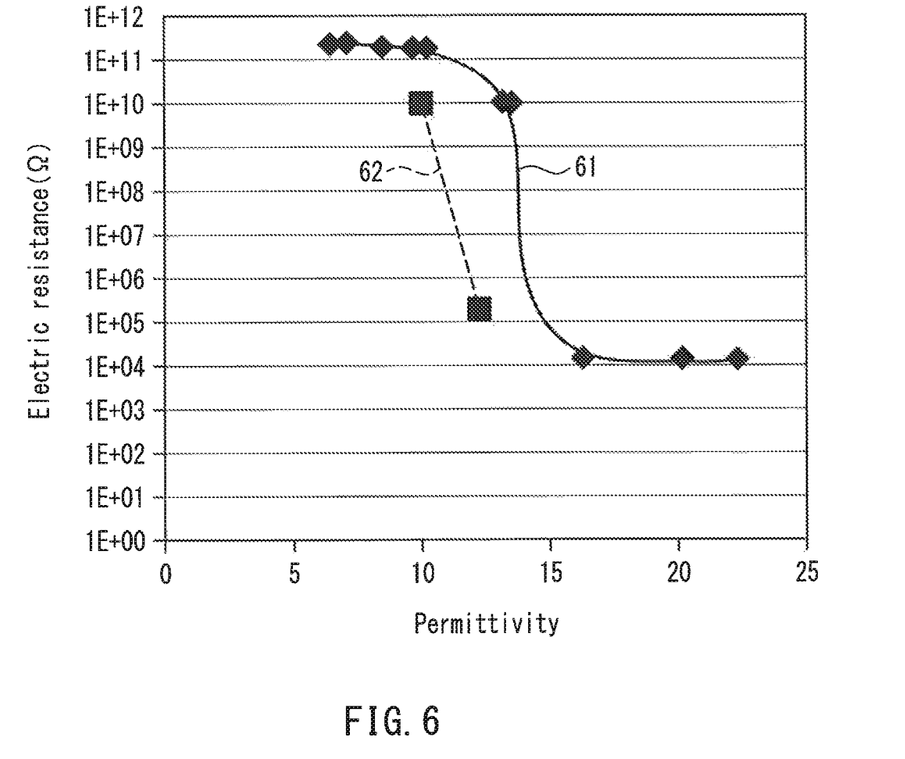
FIG. 6 is a graph illustrating a relationship between the change in the permittivity and the change in the electric resistance of the electromagnetic-wave absorbing composition associated with the addition of the filler.

FIG. 6 illustrates a relationship between the change in the permittivity and the change in the electric resistance of the electromagnetic-wave absorbing composition when the addition amount of the carbon material filler is changed.

In FIG. 6, the permittivity of each electromagnetic-wave absorbing composition (measurement sample) used in FIG. 2 was measured to plot the relationship between the electric resistance and the permittivity. As described above, FIG. 2 illustrates the relationship between the addition amount of the carbon material filler and the electric resistance.

The permittivity was measured by a capacitance method using an impedance analyzer 4291B (trade name) manufactured by Agilent Technologies Inc. More specifically, a magnetic compound as the electromagnetic-wave absorbing composition was prepared, and subjected to crosslinking and molding into a square having a thickness of 2 mm and a diagonal line of 120 mm to prepare each measurement sample. Each sample was placed between measurement electrodes and measured at a measurement frequency of 1 GHz using a test fixture 16453A (trade name) manufactured by Agilent Technologies Inc.

A solid line denoted by reference numeral 61 in FIG. 6 indicates a relationship between the permittivity and the electric resistance when carbon black is used as the filler. When the carbon black that is a particulate carbon member is used as the filler, the permittivity of the electromagnetic-wave absorbing composition can be increased up to 13 in a state of maintaining the electric resistance at a level of 10 to the 10th power Q. Meanwhile, a dotted line denoted by reference numeral 62 indicates a relationship between the permittivity and the electric resistance when the carbon nanotubes are used as the filler. It is confirmed from the dotted line that the permittivity of the electromagnetic-wave absorbing composition can be increased only up to 10 in the state of maintaining the electric resistance at 10 to the 10th power Ω, and the electric resistance sharply decreases from 10 to the 10th power Ω when the permittivity is 10 or more.

Consequently, by using the particulate carbon material that is a non-carbon nanotube carbon material as the filler in the electromagnetic-wave absorbing composition or the electromagnetic-wave absorber of this embodiment, it is possible to increase the addition amount of the filler to increase the permittivity of the electromagnetic-wave absorbing composition or the electromagnetic-wave absorber, thereby improving the electromagnetic-wave absorbing properties. Moreover, specifically in the case of the electromagnetic-wave absorber, by increasing the permittivity thereof, it is possible to achieve reductions in weight and thickness.

Generally, impedance matching is performed to equalize the impedance of the electromagnetic-wave absorbing layer and the impedance in the air (in a vacuum) in the electromagnetic-wave absorber. The reason for this is as follows. If the impedance of the electromagnetic-wave absorbing layer largely differs from the impedance in the air, undesired scattering occurs when electromagnetic waves enter the electromagnetic-wave absorbing layer from the air. This results in a significant decrease in the electromagnetic-wave absorbing properties of a resonance-type electromagnetic-wave absorbing sheet.

Since the electromagnetic-wave absorbing sheet as the electromagnetic-wave absorber of this embodiment is a nonresonant-type electromagnetic-wave absorbing sheet, a situation does not occur in which the electromagnetic-wave absorbing properties significantly decrease if the impedance of the electromagnetic-wave absorbing sheet does not match to the impedance in the air. Moreover, if the surface electric resistance of the electromagnetic-wave absorbing sheet is small, the surface reflection of electromagnetic waves occurs. However, especially when the electromagnetic-wave absorbing sheet is formed from a magnetic compound whose surface electric resistance is maintained at 10 to the 10th power Ω or more from the viewpoint of preventing an undesired short circuit when applied to an electric circuit component as the electromagnetic-wave absorbing composition, it is considered that a decrease in the electromagnetic-wave absorbing properties by the surface reflection on the electromagnetic-wave absorbing sheet does not cause a problem.

[Electromagnetic-Wave Absorbing Properties]

Figure 3:
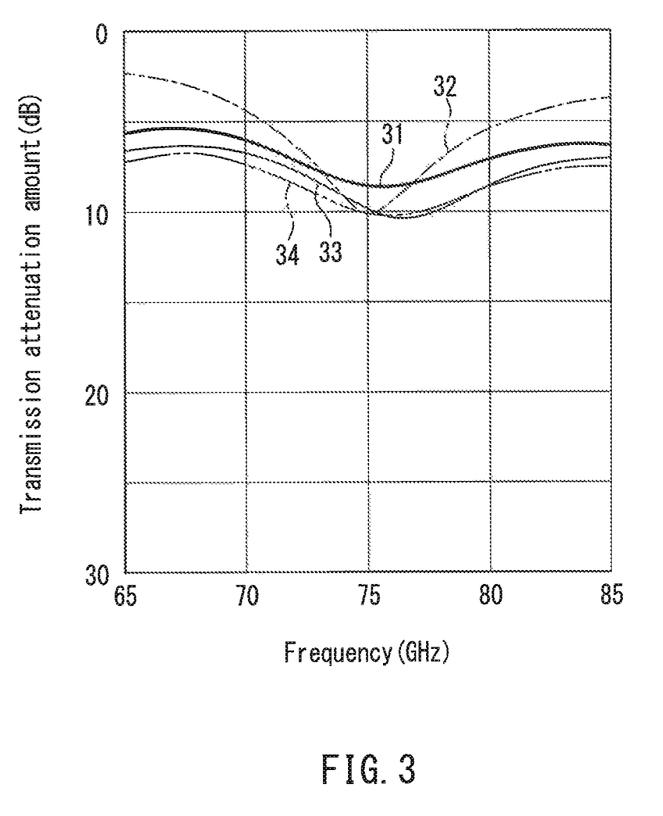
FIG. 3 is a graph illustrating a relationship between the frequency of irradiated electromagnetic waves and the transmission attenuation amount in electromagnetic-wave absorbing sheets of Examples.
Figure 4:
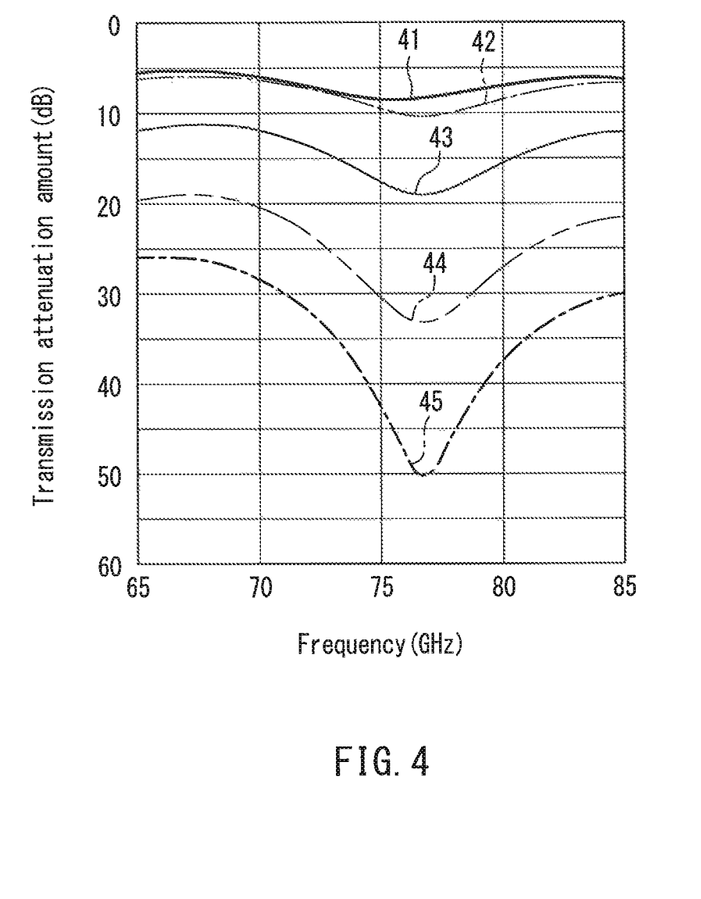
FIG. 4 is a graph illustrating a relationship between the frequency of irradiated electromagnetic waves and the transmission attenuation amount in electromagnetic-wave absorbing sheets of Examples having different thicknesses in an incident direction of electromagnetic waves.
Figure 5:
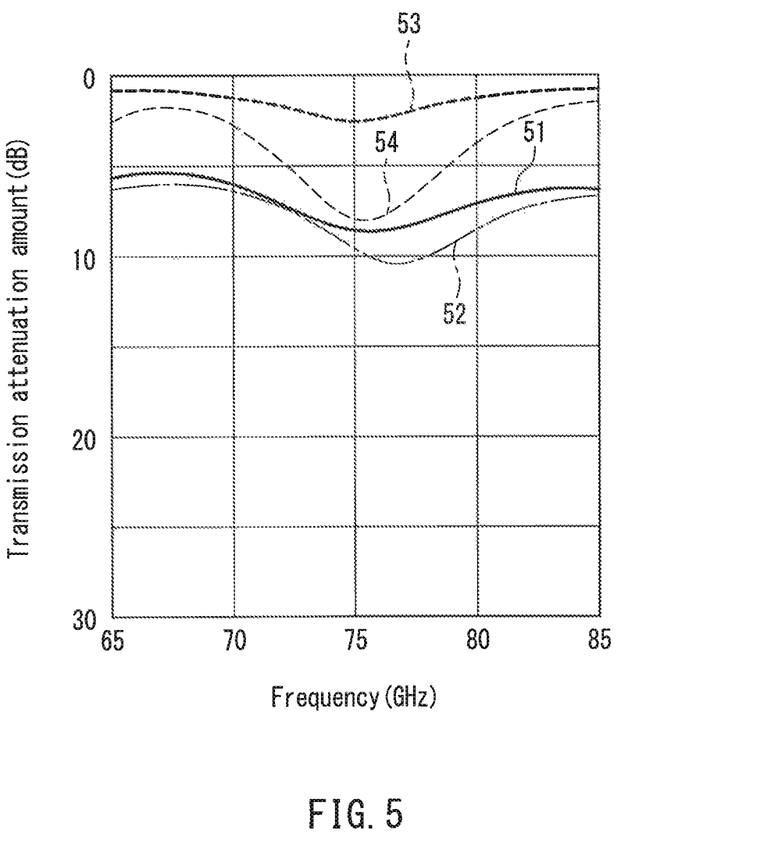
FIG. 5 is a graph illustrating a relationship between the frequency of irradiated electromagnetic waves and the transmission attenuation amount in electromagnetic-wave absorbing sheets of Examples containing different amounts of a filler and electromagnetic-wave absorbing sheets of Comparative Examples not containing a filler.

Next, electromagnetic-wave absorbing sheets were prepared to measure the electromagnetic-wave absorbing properties of the electromagnetic-wave absorbing sheets as the electromagnetic-wave absorbers of this embodiment when the content of epsilon iron oxide or strontium ferrite as the electromagnetic-wave absorbing material and the content of carbon black as the filler were changed. In Comparative Examples, electromagnetic-wave absorbing sheets in which carbon nanotubes were used as the filler and electromagnetic-wave absorbing sheets to which the filler was not added were prepared to measure the electromagnetic-wave absorbing properties thereof. Table 1 and FIGS. 3 to 5 illustrate the results.

| | Magnetic iron oxide | Content (%) | Conductive filler | $\frac{\gamma}{\alpha+\beta+\gamma}$ (%) | $\frac{\beta+\gamma}{\alpha+\beta+\gamma}$ (%) | Thickness (μm) | Electromagnetic-wave attenuation amount (dB) | Electric resistance (Ω) | Permittivity |
|---|---|---|---|---|---|---|---|---|---|
| Example 1 | Epsilon | 76 | CB | 4.0 | 45.5 | 280 | −8.6 | 1.40E+04 | 16.3 |
| Example 2 | Epsilon | 76 | CB | 4.0 | 45.5 | 350 | −9.7 | 1.40E+04 | 16.3 |
| Example 3 | Epsilon | 103 | CB | 1.2 | 51.5 | 400 | −9.9 | 2.00E+11 | 8.5 |
| Example 4 | Epsilon | 103 | CB | 2.0 | 51.8 | 400 | −10.0 | 1.70E+11 | 10.2 |
| Example 5 | Epsilon | 103 | CB | 3.1 | 52.0 | 400 | −10.2 | 1.00E+10 | 13.2 |
| Example 6 | Epsilon | 103 | CB | 3.2 | 52.0 | 400 | −10.3 | 1.00E+10 | 13.5 |
| Example 7 | Epsilon | 76 | CB | 4.0 | 45.5 | 400 | −10.4 | 1.40E+04 | 16.3 |
| Example 8 | Epsilon | 67 | CB | 6.8 | 44.3 | 400 | −10.3 | 1.35E+04 | 20.2 |
| Example 9 | Epsilon | 60 | CB | 11.3 | 44.6 | 400 | −10.2 | 1.25E+04 | 22.3 |
| Example 10 | SrFe | 103 | CB | 2.0 | 51.8 | 400 | −12.1 | 1.50E+11 | 16.7 |
| Example 11 | Epsilon | 76 | CB | 4.0 | 45.5 | 1000 | −19.0 | 1.40E+04 | 16.3 |
| Example 12 | Epsilon | 76 | CB | 4.0 | 45.5 | 2000 | −33.2 | 1.40E+04 | 16.3 |
| Example 13 | Epsilon | 76 | CB | 4.0 | 45.5 | 3000 | −47.6 | 1.40E+04 | 16.3 |
| Comp. Ex. 1 | Epsilon | 76 | CNT | 1.2 | 44.7 | 400 | −9.8 | 9.00E+09 | 10.1 |
| Comp. Ex. 2 | Epsilon | 76 | CNT | 2.0 | 44.4 | 400 | −12.1 | 1.74E+05 | 12.2 |
| Comp. Ex. 3 | Epsilon | 76 | N/A | 0 | 43.3 | 400 | −2.4 | 2.00E+11 | 6.5 |
| Comp. Ex. 4 | Epsilon | 128 | N/A | 0 | 56.1 | 400 | −8.0 | 2.20E+11 | 7.1 |
| Comp. Ex. 5 | SrFe | 103 | N/A | 0 | 52.0 | 400 | −9.5 | 2.40E+11 | 10.3 |

*Comp. Ex.: Comparative Example

In Table 1, the "magnetic iron oxide" column indicates the type of the magnetic iron oxide as the electromagnetic-wave absorbing material included in each electromagnetic-wave absorbing sheet. The term "epsilon" indicates epsilon iron oxide substituted with gallium ($\varepsilon$-$Ga_{0.47}Fe_{1.53}O_3$), and the term "SrFe" indicates $SRFE_{10.56}Al_{1.44}O_{19}$. THE "CONTENT" COLUMN INDICATES THE CONTENT OF THE MAGNETIC IRON oxide in parts by volume (percent by volume) with respect to 100 parts of silicone rubber KE-510-U (trade name, manufactured by Shin-Etsu Chemical Co., Ltd.) used as the rubber binder.

The "filler" column indicates the type of the filler added to the rubber binder. The term "CB" indicates carbon black that is a particulate carbon material, specifically Ketjen black EC600JD (trade name) manufactured by Lion Specialty Chemicals Co., Ltd. The term "CNT" indicates carbon nanotubes added as the filler, specifically C-tube 100 (trade name) manufactured by Korea CNT Co., Ltd., used in Comparative Examples.

The carbon black was 34 nm in primary particle size and 1270 $m^2$/g in BET value. The carbon nanotubes were 10 to 40 nm in diameter, 1 to 25 μm in length, and 200 $m^2$/g or less in BET value.

The term "N/A" in the filler column indicates that the filler was not added to each electromagnetic-wave absorbing sheet in Comparative Examples 3 to 5.

Parts by volume were determined by converting data in parts by weight in the same manner as the determination of the addition amount of the filler, where the density of epsilon iron oxide was set to 4.9 g/cc, the density of strontium ferrite was set to 5.1 g/cc, the density of silicone rubber was set to 1.1 g/cc, the apparent density of carbon black was set to 1.5 g/cc, and the apparent density of carbon nanotubes was set to 2.0 g/cc.

In Table 1, the value of "$\gamma/(\alpha+\beta+\gamma)$" and the value of "$(6+/(\alpha+\beta+\gamma)$" of each of Examples and Comparative Examples are expressed in percentage (%), where $\alpha$ represents the content of the rubber binder (parts by volume), $\beta$ represents the content of the magnetic iron oxide (parts by volume), and $\gamma$ represents the content of the conductive filler (parts by volume). The electromagnetic-wave absorbing sheets of Examples 1 to 13 contained a particulate carbon material as the filler. The electromagnetic-wave absorbing sheets of Comparative Examples 1 and 2 contained carbon nanotubes as the filler. The electromagnetic-wave absorbing sheets of Comparative Examples 3 to 5 did not contain any filler.

The term "thickness" in Table 1 indicates the thickness of each electromagnetic-wave absorbing sheet after press molding.

The electromagnetic-wave absorption amount (electromagnetic-wave attenuation amount) of each of electromagnetic-wave absorbing sheets of Examples 1 to 13 and Comparative Examples 1 to 5 thus formed was measured in accordance with a free space method.

Specifically, a millimeter-wave network analyzer ME7838A (trade name) manufactured by Anritsu Corporation was used to irradiate the electromagnetic-wave absorbing sheet with input waves (millimeter-waves) having a predetermined frequency from a transmission antenna via a dielectric lens and measure electromagnetic waves passing through the sheet by a reception antenna disposed on the back side of the sheet. The intensity of the irradiated electromagnetic waves and the intensity of the transmitted electromagnetic waves were measured as voltages, and the electromagnetic-wave attenuation amount was determined in dB from the intensity difference.

The permittivity of each of the electromagnetic-wave absorbing sheets of Examples 1 to 13 and Comparative Examples 1 to 5 was measured by a capacitance method using an impedance analyzer 4291B (trade name) manufactured by Agilent Technologies Inc. More specifically, a magnetic compound as an electromagnetic-wave absorbing composition was prepared, and subjected to crosslinking and molding into a square having a thickness of 2 mm and a diagonal line of 120 mm to prepare a measurement sample. This sample was placed between measurement electrodes and measured at a measurement frequency of 1 GHz using a test fixture 16453A (trade name) manufactured by Agilent Technologies Inc. Table 1 shows the measurement results.

FIG. 3 illustrates, as the electromagnetic-wave absorbing properties, the transmission attenuation amounts of the electromagnetic-wave absorbing sheet of Example 1 (reference numeral 31), the electromagnetic-wave absorbing sheet of Example 4 (reference numeral 32), the electromagnetic-wave absorbing sheet of Example 8 (reference numeral 33), and the electromagnetic-wave absorbing sheet of Example 9 (reference numeral 34). The transmission attenuation amount indicates the degree of electromagnetic-wave absorption of the sheet with respect to the frequency of irradiated electromagnetic waves.

FIG. 4 illustrates the electromagnetic-wave absorbing properties of the electromagnetic-wave absorbing sheet of Example 1 (reference numeral 41), the electromagnetic-wave absorbing sheet of Example 8 (reference numeral 42), the electromagnetic-wave absorbing sheet of Example 11 (reference numeral 43), the electromagnetic-wave absorbing sheet of Example 12 (reference numeral 44), and the electromagnetic-wave absorbing sheet of Example 13 (reference numeral 45).

FIG. 5 illustrates the electromagnetic-wave absorbing properties of the electromagnetic-wave absorbing sheet of Example 1 (reference numeral 51), the electromagnetic-wave absorbing sheet of Example 7 (reference numeral 52), the electromagnetic-wave absorbing sheet of Comparative Example 3 (reference numeral 53), and the electromagnetic-wave absorbing sheet of Comparative Example 4 (reference numeral 54).

The "electromagnetic-wave attenuation amount" column in Table 1 indicates the maximum value (maximum absolute value) (dB) of the transmission attenuation amount of each electromagnetic-wave absorbing sheet.

FIG. 3 indicates that the electromagnetic-wave absorbing sheets tend to maintain high electromagnetic-wave absorbing properties of −10 dB or more by increasing the content of the filler even when the content of epsilon iron oxide is small (Examples 4, 8, and 9).

FIG. 4 indicates that, when the content of the epsilon iron oxide and the content of the filler are the same, the electromagnetic-wave attenuation amount increases as the thickness of the electromagnetic-wave absorbing sheet increases (Examples 1, 7, 11, 12, and 13). Although not illustrated in FIG. 4 for the sake of simplifying the drawing, the electromagnetic-wave absorbing sheet of Example 2 exhibits the same tendency.

FIG. 5 indicates that, by adding the filler, the electromagnetic-wave absorbing properties are improved when the content of the magnetic iron oxide and the thickness of the electromagnetic-wave absorbing sheets are the same (Example 7 and Comparative Example 3) and that, by adding the filler, the electromagnetic-wave absorbing properties can be enhanced even when the content of the magnetic iron oxide is small and the electromagnetic-wave absorbing sheet is thin (Example 1 and Comparative Example 4).

Moreover, Table 1 indicates that, even when the amount of the particulate carbon black is 3.2 parts by volume or less, the electric resistance is larger than 10 to the 10th power Ω in a range up to 1.2 parts by volume, and high insulation properties can be obtained (Examples 3, 4, 5, 6, and 10).

Moreover, the results of Examples 1 to 13 and Comparative Examples 1 to 5 confirm the following. By adding the filler made of a particulate carbon material to the electromagnetic-wave absorbing sheet, it is possible to improve the electromagnetic-wave absorbing properties of the electromagnetic-wave absorbing sheet. Further, by setting the content (parts by volume) of the magnetic iron oxide to 60 to 110 parts with respect to 100 parts of the resin binder and setting the value of "$(\beta+\gamma)/(\alpha+\beta+\gamma)$", which indicates the total content (parts by volume) of the magnetic iron oxide and the conductive filler, to a range of 43.0 to 52.0, it is possible to provide an electromagnetic-wave absorbing sheet having a high electromagnetic wave attenuation rate (electromagnetic-wave absorbing properties) of −8.5 dB or more and having elasticity of elongating in an in-plane direction while being easily attached to e.g., a curved surface.

In other words, since various types of rubber binders can be used as the binder constituting the electromagnetic-wave absorbing layer, the electromagnetic-wave absorbing sheet as the electromagnetic-wave absorber of this embodiment particularly has elasticity of easily elongating and contracting in an in-plane direction of the electromagnetic-wave absorbing sheet. Further, since the electromagnetic-wave absorbing layer is formed by adding the magnetic iron oxide to the rubber binder, the electromagnetic-wave absorbing sheet of this embodiment has high flexibility while having high elasticity, whereby the electromagnetic-wave absorbing sheet can be rolled up in handling and easily arranged along a curved surface.

In this case, by setting the value of "$\gamma/(\alpha+\beta+\gamma)$", which indicates the addition proportion of the conductive filler, to a range of 1.2 to 3.2 (parts by volume), it is possible to maintain the surface electric resistance at a level of 10 to the 10th power Ω (10 GΩ). It is confirmed that it is possible to provide a highly practical electromagnetic-wave absorbing sheet that eliminate or reduce an undesired short circuit even when the sheet directly contacts a terminal portion of an electric circuit component.

The results shown in Table 1 and FIGS. 3 to 5 are not limited to the electromagnetic-wave absorbing sheet that is the sheet-shaped electromagnetic-wave absorber. Since the electromagnetic-wave absorbing sheet of this embodiment is produced using the above electromagnetic-wave absorbing composition, results similar to those on the electromagnetic-wave absorbing sheets shown in Table 1 can be obtained for the electromagnetic-wave absorbing composition that is the magnetic compound.

[Electromagnetic-Wave Absorber not in a Sheet Shape]

The above embodiment exemplifies the electromagnetic-wave absorbing sheets produced by applying the electromagnetic-wave absorbing composition in a layer form. However, the electromagnetic-wave absorber disclosed in the present application is not limited to a sheet shape and may have a block shape with a certain thickness.

The block-shaped electromagnetic-wave absorber can be produced by a molding method such as an extrusion molding or an injection molding using the magnetic compound including the magnetic iron oxide powder as the electromagnetic-wave absorbing material, the rubber binder, and the filler, as described in the method for producing the electromagnetic-wave absorbing sheet.

For example, the block-shaped electromagnetic-wave absorber can be produced by blending magnetic iron oxide powder, a binder, and as needed a dispersant in advance with a pressurized kneader, an extruder, a roll mill, etc. These blended materials are supplied from a resin supply port of an extrusion molding machine into a plasticizing cylinder.

The extrusion molding machine may be an ordinary extrusion molding machine that includes a plasticizing cylinder, a die provided at the tip of the plasticizing cylinder, a screw rotatably disposed in the plasticizing cylinder, and a driving mechanism that drives the screw.

The material molten by a band heater of the extrusion molding machine is fed forward by the rotation of the screw and extruded from the tip. Thus, an electromagnetic-wave absorber having a predetermined shape can be obtained.

Moreover, the block-shaped electromagnetic-wave absorber as a molded member also can be produced by blending magnetic iron oxide powder, a dispersant, and a binder in advance as needed. These blended materials are supplied from a resin supply port of an injection molding machine into a plasticizing cylinder, melted and kneaded using a screw in the plasticizing cylinder, and then injected as a molten resin into a mold that is joined to the tip of the injection molding machine.

The molding method such as the extrusion molding or the injection molding described above as a method for producing the block-shaped electromagnetic-wave absorber can be used as a method for producing the electromagnetic-wave absorbing sheet by adjusting the thickness of an electromagnetic-wave absorber to be formed.

The block-shaped electromagnetic-wave absorber having a predetermined thickness is not as elastic or flexible as the sheet-shaped electromagnetic-wave absorber even when the rubber binder is used. The block-shaped electromagnetic-wave absorber, however, is elastic enough to easily follow, e.g., a gentle curve of an arrangement surface or irregularities on an arrangement surface, and can arranged in close contact with a noise source.

As described above, since the electromagnetic-wave absorbing composition and the electromagnetic-wave absorber of this embodiment include the magnetic iron oxide as the electromagnetic-wave absorbing material and the filler in the rubber binder, the electromagnetic-wave absorbing composition can be produced as a paste-like electromagnetic-wave absorbing composition that favorably absorbs electromagnetic waves of high frequencies in a millimeter-wave band, and the electromagnetic-wave absorber can be produced as an electromagnetic-wave absorber that has high elasticity while having flexibility especially when the electromagnetic-wave absorber is formed into a sheet.

In the above embodiment, a preferable proportion of the magnetic iron oxide that is the electromagnetic-wave absorbing material, the rubber binder, and the conductive filler in the electromagnetic-wave absorbing composition and the electromagnetic-wave absorber disclosed in the present application has been described based on parts by volume as an index. However, in actually producing the electromagnetic-wave absorbing composition or the electromagnetic-wave absorber using the electromagnetic-wave absorbing composition, it is useful to determine a mixing proportion of each ingredient based on parts by weight. Thus, in producing the electromagnetic-wave absorbing composition disclosed in the present application, it is preferable to determine parts by weight that will be converted into preferable parts by volume using a specific gravity of each ingredient. Meanwhile, in analyzing a mixing proportion of each ingredient from a produced electromagnetic-wave absorbing composition or a produced electromagnetic-wave absorber, parts by weight of each ingredient can be determined by a thermal decomposition method or a chemical decomposition method, and parts by volume of each ingredient can be determined by observing an enlarged cross-section of each sample using a microscope such as an SEM or a TEM.

In the above embodiment, epsilon iron oxide is mainly exemplified as the electromagnetic-wave absorbing material. As described above, by using epsilon iron oxide, it is possible to form an electromagnetic-wave absorbing sheet that absorbs electromagnetic waves of 30 GHz to 300 GHz (millimeter-wave band). Further, by using rhodium or the like as the metal material with which the Fe sites are substituted, it is possible to obtain an electromagnetic-wave absorbing sheet that absorbs electromagnetic waves of one terahertz, which is the highest frequency defined as electromagnetic wave.

However, as described above, in the electromagnetic-wave absorbing sheet disclosed in the present application, the magnetic iron oxide to be used as the electromagnetic-wave absorbing material of the electromagnetic-wave absorbing layer is not limited to epsilon iron oxide and may be hexagonal ferrite including strontium ferrite.

Hexagonal ferrite as a ferrite electromagnetic absorber exhibits electromagnetic-wave absorbing properties in a frequency band of 76 GHz. Strontium ferrite exhibits electromagnetic-wave absorbing properties in a frequency band of several tens of gigahertz. Therefore, by forming an electromagnetic-wave absorbing composition or an electromagnetic-wave absorber using particles of magnetic iron oxide other than epsilon iron oxide that exhibits electromagnetic-wave absorbing properties in the millimeter-wave band from 30 GHz to 300 GHz, a rubber binder, and a filler made of a particulate carbon material, it is possible to produce an electromagnetic-wave absorbing member that absorbs electromagnetic waves in the millimeter-wave band while having elasticity.

In producing the electromagnetic-wave absorbing composition disclosed in the present application, a roll mill or an extruder can be used other than various kneaders. The molding can be extrusion molding, injection molding, or calender (roll) molding other than press molding.

Further, it is possible to produce the electromagnetic-wave absorber by dispersing the magnetic iron oxide powder in a solvent using a media disperser or the like, applying the electromagnetic-wave absorbing composition on a release substrate by spin coating, die coating, or gravure coating (using one of the coating methods), peeling the composition from the substrate, and (forming the composition as a single layer or stacked layers), followed by calendering.

Moreover, the electromagnetic-wave absorber disclosed in the present application is not limited to the sheet-shaped absorber and the block-shaped absorber as described above and may have a certain shape such as a thin layer shape formed by application of the electromagnetic-wave absorbing composition or a corn shape formed by hot pressing or injection molding.

INDUSTRIAL APPLICABILITY

The electromagnetic-wave absorbing composition and the electromagnetic-wave absorber disclosed in the present application are useful as an electromagnetic-wave absorbing material that absorbs electromagnetic waves in a high frequency band in or above the millimeter-wave band while having elasticity.

DESCRIPTION OF REFERENCE NUMERALS 1 electromagnetic-wave absorbing sheet (electromagnetic-wave absorber)
1a epsilon iron oxide (electromagnetic-wave absorbing material, magnetic iron oxide)
1b rubber binder
1c filler

The invention claimed is:
1. An electromagnetic-wave absorber, comprising:
a rubber binder;
carbon black that is a filler made of a particulate carbon material; and
a magnetic iron oxide that magnetically resonates in a frequency band in or above a millimeter-wave band as an electromagnetic-wave absorbing material, wherein when the magnetic iron oxide is 60 parts by volume or more and 110 parts by volume or less with respect to 100 parts by volume of the rubber binder, and $\alpha$ represents parts by volume of the rubber binder, $\beta$ represents parts by volume of the magnetic iron oxide, and $\gamma$ represents parts by volume of the carbon black, a value of $(\beta+\gamma)/(\alpha+\beta+\gamma)\times 100$ is 43.0 or more and 52.0 or less, and a value of $\gamma/(\alpha+\beta+\gamma)\times 100$ is 1.2 or more and 2.0 or less, and wherein the electromagnetic-wave absorber is a nonresonant-type electromagnetic-wave absorber that is not provided with an electromagnetic-wave reflective layer for reflecting incident electromagnetic waves, an electric resistance of the electromagnetic-wave absorber is larger than 10 to the 10th power $\Omega$, and a transmission attenuation amount of electromagnetic waves passing through the electromagnetic-wave absorber is −8.5 dB or more.

2. The electromagnetic-wave absorber according to claim 1, wherein the magnetic iron oxide is epsilon iron oxide or strontium ferrite.

3. The electromagnetic-wave absorber according to claim 2, wherein part of a Fe site of the epsilon iron oxide is substituted with a trivalent metal atom.

4. The electromagnetic-wave absorber according to claim 1, wherein the electromagnetic-wave absorber has a thickness of 400 μm or more in an incident direction of electromagnetic waves.

5. The electromagnetic-wave absorber according to claim 1, wherein an adhesive layer is stacked on either of the surfaces of the electromagnetic-wave absorber.

* * * * *